United States Patent
Takao et al.

(10) Patent No.: US 11,152,241 B2
(45) Date of Patent: Oct. 19, 2021

(54) SUBSTRATE PROCESSING APPARATUS AND NOTIFICATION METHOD

(71) Applicant: Tokyo Electron Limited, Tokyo (JP)

(72) Inventors: Rintaro Takao, Sapporo (JP); Hiromichi Fujii, Sapporo (JP); Yoshihide Kagihara, Sapporo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 276 days.

(21) Appl. No.: 16/177,725

(22) Filed: Nov. 1, 2018

(65) Prior Publication Data
US 2019/0139804 A1    May 9, 2019

(30) Foreign Application Priority Data

Nov. 6, 2017 (JP) .............................. JP2017-214018

(51) Int. Cl.
     *H01L 21/677*      (2006.01)
     *H01L 21/67*      (2006.01)
     *C23C 16/458*      (2006.01)

(52) U.S. Cl.
CPC .... *H01L 21/67745* (2013.01); *C23C 16/4584* (2013.01); *H01L 21/67201* (2013.01); *H01L 21/67265* (2013.01); *H01L 21/67276* (2013.01); *H01L 21/67288* (2013.01); *H01L 21/67754* (2013.01); *H01L 21/67766* (2013.01)

(58) Field of Classification Search
CPC .................... H01L 21/67745; H01L 21/67754
See application file for complete search history.

(56) References Cited

U.S. PATENT DOCUMENTS

| | | | | |
|---|---|---|---|---|
| 10,061,214 B2* | 8/2018 | Sagawa | ............... | G03F 7/70541 |
| 10,186,422 B2* | 1/2019 | Ito | .................... | H01L 21/02617 |
| 10,236,199 B2* | 3/2019 | Ehara | ................ | H01L 21/67745 |

(Continued)

FOREIGN PATENT DOCUMENTS

| | | |
|---|---|---|
| JP | 2001-176763 A | 6/2001 |
| JP | 2004-259933 A | 9/2004 |

(Continued)

*Primary Examiner* — Jonathan Snelting
(74) *Attorney, Agent, or Firm* — Abelman, Frayne & Schwab (57) ABSTRACT

A substrate processing apparatus disclosed herein is capable of communicating with an external control apparatus. The substrate processing apparatus includes: a container placing portion configured to place thereon a transport container accommodating a product substrate therein; a dummy substrate accommodating unit configured to accommodate dummy substrates therein; a transport chamber provided with a transport mechanism configured to transport the product substrate and the dummy substrates; a processing chamber configured to process the product substrate and the dummy substrates transported thereto by the transport mechanism; and a controller configured to determine whether or not a number of unusable dummy substrates among the dummy substrates accommodated in the dummy substrate accommodating unit is equal to or greater than a set value, and notify the external control device of a warning when it is determined that the number of dummy substrates is equal to or greater than the set value.

14 Claims, 4 Drawing Sheets

(56) References Cited

U.S. PATENT DOCUMENTS

2012/0314193 A1* 12/2012 Sagawa ............... G03F 7/70541
  355/30
2016/0115622 A1* 4/2016 Ito ........................... C23C 16/54
  117/88

FOREIGN PATENT DOCUMENTS

| JP | 2012-109333 A | 6/2012 |
| JP | 2013-225659 A | 10/2013 |
| JP | 2016-066714 A | 4/2016 |
| JP | 2016-081952 A | 5/2016 |
| JP | 6084202 B | 2/2017 |

* cited by examiner

SUBSTRATE PROCESSING APPARATUS AND NOTIFICATION METHOD

CROSS-REFERENCE TO RELATED APPLICATIONS

This application is based on and claims priority from Japanese Patent Application No. 2017-214018, filed on Nov. 6, 2017 with the Japan Patent Office, the disclosure of which is incorporated herein in its entirety by reference.

TECHNICAL FIELD

The present disclosure relates to a substrate processing apparatus and a notification method.

BACKGROUND

There has been known a processing apparatus that forms a film on a substrate by placing a plurality of substrates on a rotary table provided in a vacuum container in the direction of rotation of the rotary table and supplying gas from a gas supply unit provided in the radial direction of the rotary table in a state where the rotary table is rotated (see, e.g., Japanese Patent Laid-Open Publication No. 2016-066714).

In this processing apparatus, when product wafers are not placed on all of placing portions formed on the top surface of the rotary table so as to place substrates thereon, there is a possibility that a uniform film cannot be formed on the product wafers. Therefore, a dummy wafer is placed on a placing portion on which no product wafer is placed, and a film formation processing is performed in a state where the wafers are placed on all of the placing portions. The dummy wafer is accommodated in a transport container loaded in a dummy wafer storage region disposed in a normal-pressure transport chamber, and when a film exceeding a specified cumulative film thickness value is deposited thereon as a result of repeated use in film formation processings, the dummy wafer is replaced.

SUMMARY

A substrate processing apparatus disclosed herein is capable of communicating with an external control apparatus and includes: a container placing portion configured to place thereon a transport container accommodating a product substrate therein; a dummy substrate accommodating unit provided separately from the container placing portion and configured to accommodate dummy substrates therein; a transport chamber provided with a transport mechanism configured to transport the product substrate and the dummy substrates; a processing chamber configured to process the product substrate and the dummy substrates transported thereto by the transport mechanism in a state of accommodating the product substrate and the dummy substrates therein; and a controller configured to determine whether or not a number of unusable dummy substrates among the dummy substrates accommodated in the dummy substrate accommodating unit is equal to or greater than a set value, and notify the external control device of a warning when it is determined that the number of dummy substrates is equal to or greater than the set value.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the above-described processing apparatus, it is not possible to determine a replacement timing of a substrate in a dummy substrate accommodating unit with an external control device such as, for example, a host computer.

Thus, an aspect of the present disclosure provides a substrate processing apparatus capable of determining a replacement timing of a substrate in a dummy substrate accommodating unit with an external control device.

In order to achieve the above described object, a substrate processing apparatus disclosed herein is capable of communicating with an external control apparatus and includes: a container placing portion configured to place thereon a transport container accommodating a product substrate therein; a dummy substrate accommodating unit provided separately from the container placing portion and configured to accommodate dummy substrates therein; a transport chamber provided with a transport mechanism configured to transport the product substrate and the dummy substrates; a processing chamber configured to process the product substrate and the dummy substrates transported thereto by the transport mechanism in a state of accommodating the product substrate and the dummy substrates therein; and a controller configured to determine whether or not a number of unusable dummy substrates among the dummy substrates accommodated in the dummy substrate accommodating unit is equal to or greater than a set value, and notify the external control device of a warning when it is determined that the number of dummy substrates is equal to or greater than the set value.

In the above-described substrate processing apparatus, the controller is configured to prohibit unloading of the dummy substrates from the dummy substrate accommodating unit when it is determined that the number of unusable dummy substrates is equal to or greater than the set value.

In the above-described substrate processing apparatus, the controller is configured to notify the external control device that the dummy substrates are replaceable when all of the dummy substrates unloaded from the dummy substrate accommodating unit are collected in the dummy substrate accommodating unit.

In the above-described substrate processing apparatus, the controller is configured to replace the dummy substrates accommodated in the dummy substrate accommodating unit when a signal instructing replacement of the dummy substrates is received from the external control device.

In the above-described substrate processing apparatus, the controller is configured to cancel prohibition of unloading of the dummy substrates from the dummy substrate accommodating unit when replacement of the dummy substrates is completed and the number of unusable dummy substrates is less than the set value.

In the above-described substrate processing apparatus, the unusable dummy substrates are dummy substrates having a cumulative film thickness thereon which is equal to or greater than a predetermined film thickness, or dummy substrates subjected to a predetermined number of times of processing or more in the processing chamber.

In the above-described substrate processing apparatus, the controller is configured to determine whether all the dummy substrates are unusable dummy substrates when the number of the dummy substrates accommodated in the dummy substrate accommodating unit is less than the set value, and notify the external control device of a warning when it is determined that all the dummy substrates are unusable.

In accordance of an aspect of the present disclosure, provided is a method of notifying a replacement timing of a dummy substrate in a substrate processing apparatus configured to communicate with an external control device. The method includes: determining whether or not the number of unusable dummy substrates among dummy substrates accommodated in a dummy substrate accommodating unit provided separately from a container placing portion configured to place thereon a transport container accommodating a product substrate therein is equal to or greater than a set value; and notifying the external control device of a warning when it is determined that the number of unusable dummy substrates is equal to or greater than the set value.

With the substrate processing apparatus disclosed herein, it is possible to determine a replacement timing of a substrate in a dummy substrate accommodating unit with an external control device.

Hereinafter, exemplary embodiments for executing the present disclosure will be described with reference to drawings. Meanwhile, in the specification and drawings, the same reference numerals are used to denote substantially the same components, and redundant descriptions will be omitted.

(Substrate Processing Apparatus)

Figure 1:
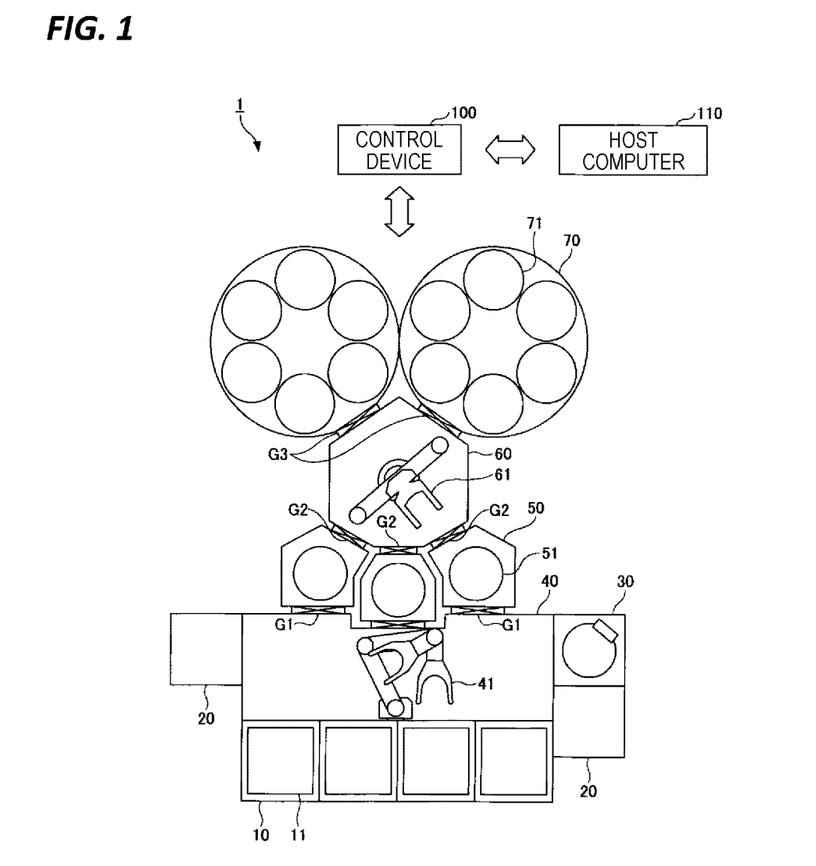
FIG. 1 is a schematic view illustrating a configuration of a substrate processing apparatus according to an embodiment of the present disclosure.
Figure 2:
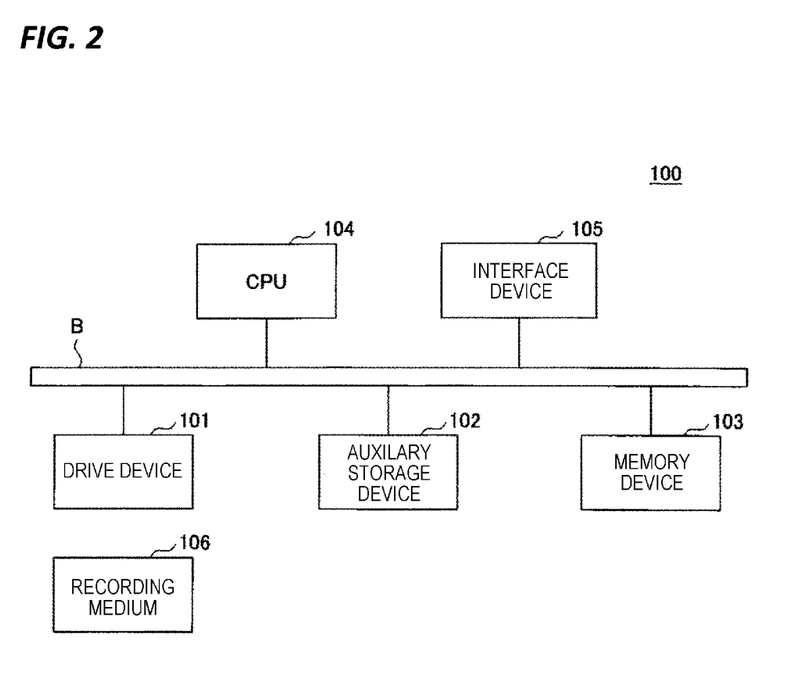
FIG. 2 is a view illustrating an exemplary hardware configuration of a control device according to an embodiment of the present disclosure.

A substrate processing apparatus according to an embodiment of the present disclosure will be described. FIG. 1 is a schematic view illustrating a configuration of a substrate processing apparatus according to an embodiment of the present disclosure. FIG. 2 is a view illustrating an exemplary hardware configuration of a control device according to an embodiment of the present disclosure.

As illustrated in FIG. 1, the substrate processing apparatus 1 includes a load port 10, a dummy storage 20, an aligner 30, a normal-pressure transport chamber 40, a load-lock chamber 50, a vacuum transport chamber 60, a chamber 70, and a control device 100.

The load port 10 is disposed adjacent to the normal-pressure transport chamber 40. A transport container 11 capable of accommodating and transporting a plurality of semiconductor wafers (hereinafter, simply referred to as "wafers") are placed on the load port 10. The wafers include, for example, product wafers and dummy wafers. The product wafers are wafers to be used for forming devices. The dummy wafers are wafers used instead of the product wafers and are used, for example, when a processing in which it is not required to use a product wafer is performed and when no product wafer is placed on a placing portion formed on the top surface of a rotary table provided in the chamber 70. The transport container 11 may be, for example, a front opening unified pod (FOUP). FIG. 1 exemplifies a case where the number of load ports 10 is four. However, for example, the number of load ports 10 may be three or less, or five or more.

The dummy storage 20 is disposed adjacent to the normal-pressure transport chamber 40 separately from the load ports 10. In the dummy storage 20, a plurality of dummy wafers are accommodated substantially horizontally at predetermined intervals. FIG. 1 exemplifies a case where the number of dummy storages 20 is two. However, the number of dummy storages 20 may be, for example, one, or three or more.

The aligner 30 is disposed adjacent to the normal-pressure transport chamber 40. The aligner 30 is used for adjusting the transport position of a wafer with respect to the load-lock chamber 50. Specifically, the aligner 30 detects the center position of a wafer and a notch direction with respect to the center, and adjusts the transport position of the wafer such that the center position and the notch direction of the wafer in the load-lock chamber 50 become the predetermined position and the predetermined direction.

The normal-pressure transport chamber 40 connects the load ports 10 and the load-lock chambers 50. Further, the normal-pressure transport chamber 40 connects the dummy storages 20, the load ports 10, and the load-lock chambers 50. In the normal-pressure transport chamber 40, a first transport arm 41 is provided. The first transport arm 41 is a transport arm made of, for example, an articulated arm, and loads or unloads a product wafer into or from the load port 10 or the load-lock chamber 50. In addition, the first transport arm 41 loads or unloads a dummy wafer into or from the load port 10, the dummy storage 20, or the load-lock chamber 50.

The load-lock chamber 50 connects the normal-pressure transport chamber 40 and the vacuum transport chamber 60 so as to load or unload a wafer into or out of the normal-pressure transport chamber 40 or the vacuum chamber 60. The load-lock chamber 50 is connected to the normal-pressure transport chamber 40 through a gate valve G1 and is connected to the vacuum transport chamber 60 through the gate valve G2. The load-lock chamber 50 is configured as an inner pressure-variable chamber of which the inside is capable of being switched between a vacuum state and an atmospheric pressure state, and has a columnar stage 51 disposed therein. When loading a wafer W from the normal-pressure transport chamber 40 into the vacuum transport chamber 60, the load-lock chamber 50 keeps the inside thereof at the atmospheric pressure, receives the wafer from the normal-pressure transport chamber 40, then reduces the pressure of the inside thereof, and then loads the wafer into the transport chamber 60. When unloading a wafer from the vacuum transport chamber 60 to the normal-pressure transport chamber 40, the load-lock chamber 50 keeps the inside thereof at the vacuum, receives the wafer from the vacuum transfer chamber 60, then boosts the inside thereof to the atmospheric pressure, and loads the wafer into the normal-pressure transport chamber 40. The stage 51 has three thin rod-shaped lift pins (not illustrated) which are projectable from the top surface thereof. Respective lift pins are disposed on the same circumference in a plan view, support and lift the wafer by protruding from the top surface of the stage 51, and cause the wafer to be placed on the stage 51 by being retracted to the inside of the stage 51. FIG. 1 exemplifies the case where the number of load-lock chambers 50 is three. However, for example, the number of load-lock chambers 50 may be two or less, or four or more.

The vacuum transport chamber 60 connects the load-lock chambers 50 to each chamber 70. The vacuum transport chamber 60 is connected to each chamber 70 through a gate valve G3. Further, the indoor atmosphere in the vacuum transfer chamber 60 is maintained in a vacuum state. In the vacuum transport chamber 60, a second transport arm 61 is provided. The second transport arm 61 is a transport arm made of, for example, an articulated arm, and loads or unloads a wafer into or from each load port 70 or load-lock chamber 50.

The chambers 70 are disposed around the vacuum transport chamber 60 and connected to the vacuum transport chamber 60 through gate valves G3. A wafer is placed on each of the placing portions 71 formed in the rotation direction of the rotary table provided in each chamber 70 and a gas is supplied from gas supply portions provided in the radial direction of the rotary table in the state of rotating the rotary table. As a result, a film is formed on the wafer in the chamber 70.

As illustrated in FIG. 2, the control device 100 is a computer including, for example, a drive device 101, an auxiliary storage device 102, a memory device 103, a CPU 104, and an interface device 105, which are mutually connected via a bus B. A program for realizing a processing in the control device 100 is provided by a recording medium 106 such as, for example, a CD-ROM. When the recording medium 106 storing the program is set in the drive device 101, the program is installed from the recording medium 106 to the auxiliary storage device 102 via the drive device 101. However, it is not always necessary to install the program from the recording medium 106, and the program may be downloaded from another computer via a network. The auxiliary storage device 102 stores necessary programs such as, for example, installed programs and recipes. The memory device 103 reads out a program from the auxiliary storage device 102 and stores the program when an instruction to activate the program is issued. The CPU 104 executes functions associated with the substrate processing apparatus 1 according to the program stored in the memory device 103. The interface device 105 is used as an interface for connecting to the network.

The control device 100 may be provided inside or outside the substrate processing apparatus 1. When the control apparatus 100 is provided outside the substrate processing apparatus 1, the control apparatus 100 may control the substrate processing apparatus 1 by, for example, a wired or wireless communication unit. The control apparatus 100 is connected to a host computer 110, which manages a plurality of apparatuses including the substrate processing apparatus 1 in a unitary management manner, by the wired or wireless communication unit so as to be capable of mutually communicating with the host computer 110.

(Operation of Substrate Processing Apparatus)

Figure 3:
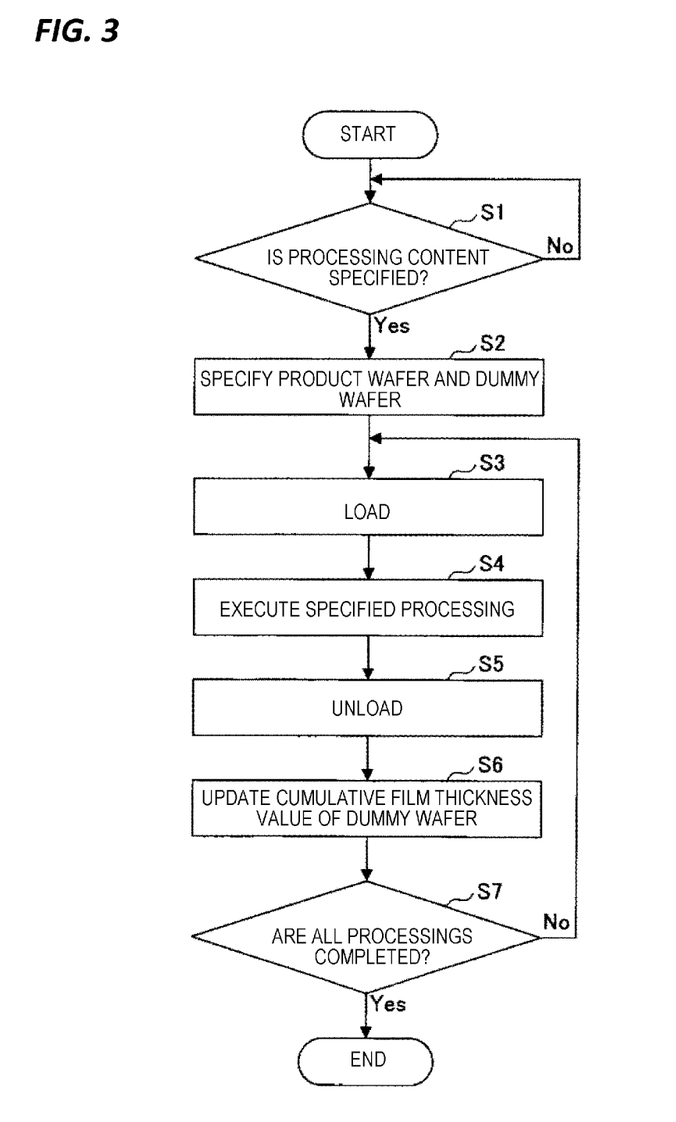
FIG. 3 is a flowchart illustrating an exemplary substrate processing method according to an embodiment of the present disclosure.

Next, an exemplary substrate processing method according to an embodiment of the present disclosure will be described with reference to FIG. 3. FIG. 3 is a flowchart illustrating an substrate processing method using the substrate processing apparatus 1 according to an embodiment of the present disclosure. In the following description, the operations of respective units constituting the substrate processing apparatus 1 are controlled by the control device 100.

In step S1, the control device 100 determines whether or not a processing content (e.g., a recipe stored in the auxiliary storage device 102) is specified. When it is determined that the processing content is not specified (step S1: No), step S1 is repeated until the processing content is specified. When the process content is specified (step S1: Yes), the process proceeds to step S2.

In step S2, the control device 100 specifies a product wafer and a dummy wafer to be used according to the specified processing content. For example, the control device 100 specifies a product wafer to be processed from unprocessed product wafers accommodated in the transport container 11 placed on the load port 10. In addition, the control device 100 specifies a dummy wafer to be used for processing from the dummy wafers accommodated in the dummy storage 20.

In step S3, the control device 100 loads the product wafer and the dummy wafer specified in step S2 into the placing portions 71 of the rotary table provided in the chamber 70. For example, the specified product wafer is transported from the transport container 11 to the aligner 30 by the first transport arm 41 such that the transport position of the product wafer is adjusted with respect to the load-lock chamber 50. Subsequently, the gate valve G1 is opened, and the product wafer of which the transport position has been adjusted is transported to the load-lock chamber 50. Further, the control device 100 transports the specified dummy wafer from the dummy storage 20 to the aligner 30 by the first transport arm 41 such that the transport position of the dummy wafer is adjusted with respect to the load-lock chamber 50. Subsequently, the gate valve G1 is opened, and the dummy wafer of which the transport position has been adjusted is transported to the load-lock chamber 50. Subsequently, after closing the gate valve G1, the load-lock chamber 50 is brought into a vacuum state. Thereafter, after the gate valve G2 and the gate valve G3 are opened, the product wafer and the dummy wafer transported to the load-lock chamber 50 are placed on the placing portions 71 of the rotary table provided in the chamber 70 by the second transport arm 61.

In step S4, after closing the gate valve G3, the control device 100 executes a specified processing by controlling respective units of the substrate processing apparatus 1 according to the specified recipe. For example, by supplying a processing gas to the wafer while revolving the wafer by the rotary table, a film formation processing of the wafer is performed to form a uniform thin film on the wafer.

In step S5, the control device 100 unloads the product wafer and the dummy wafer which have been subjected to the film formation processing from the chamber 70. For example, after opening the gate valve G3 and the gate valve G2, the control device 100 transports the product wafer and the dummy wafer, which have been subjected to the film formation process, to the load-lock chamber 50 by the second transport arm 61. Subsequently, after closing the gate valve G2, the control device 100 brings the inside of the load-lock chamber 50 into a normal-pressure state. When the inside of the load-lock chamber 50 is brought into the normal-pressure state, the control device 100 opens the gate valve G1, and then accommodates the product wafer, which has been transported to the load-lock chamber 50 onto the load port 10, in the transport container 11 by the first transport arm 41. Further, the control device 100 accommodates the dummy wafer, which has been transported to the load-lock chamber 50, in the dummy storage 20 by the first transport arm 41.

In step S6, the control device 100 calculates, for example, the number of times of using dummy wafers accommodated in the dummy storage 20 and a cumulative film thickness, etc., stores (updates), for example, the calculated number of times of using the dummy wafers and the cumulative film thickness in the auxiliary storage device 102.

In step S7, the control device 100 determines whether or not all the processings have been completed. When it is determined that all the processings have not been completed (step S7: No), the process returns to step S3 and the specified product wafer and dummy wafer are loaded again into the placing portions 71 of the rotary table provided in the chamber 70. Meanwhile, when it is determined that all the processings are completed (step S7: Yes), the substrate processing is terminated.

By the way, the dummy wafer is often used repeatedly, and when the dummy wafer is repeatedly used, the cumulative film thickness of the film deposited on the dummy wafer becomes large. When the cumulative film thickness becomes large, particles may be generated.

Therefore, when the cumulative film thickness of the film formed on the dummy wafer becomes equal to or larger than the predetermined film thickness, a warning that the dummy wafer is unusable is displayed on a monitor of the substrate processing apparatus 1. When an operator confirms the warning displayed on the monitor of the substrate processing apparatus 1, the operator places a transport container containing new dummy wafers in the load port 10 and performs replacement of the unusable dummy wafers accommodated in the dummy storage 20 with the new dummy wafers.

However, it was impossible to determine the replacement timing of dummy wafers accommodated in the dummy storage 20 by the host computer 110 that manages a plurality of apparatuses including the substrate processing apparatus 1 in a unitary management manner.

Hereinafter, a description will be made of a process for notifying the replacement timing of a dummy wafer (notification method) in the substrate processing apparatus 1 according to an embodiment of the present disclosure capable of determining the replacement timing of a dummy wafer accommodated in the dummy storage 20 by the host computer 110.

(Replacement Timing Notification Process)

Figure 4:
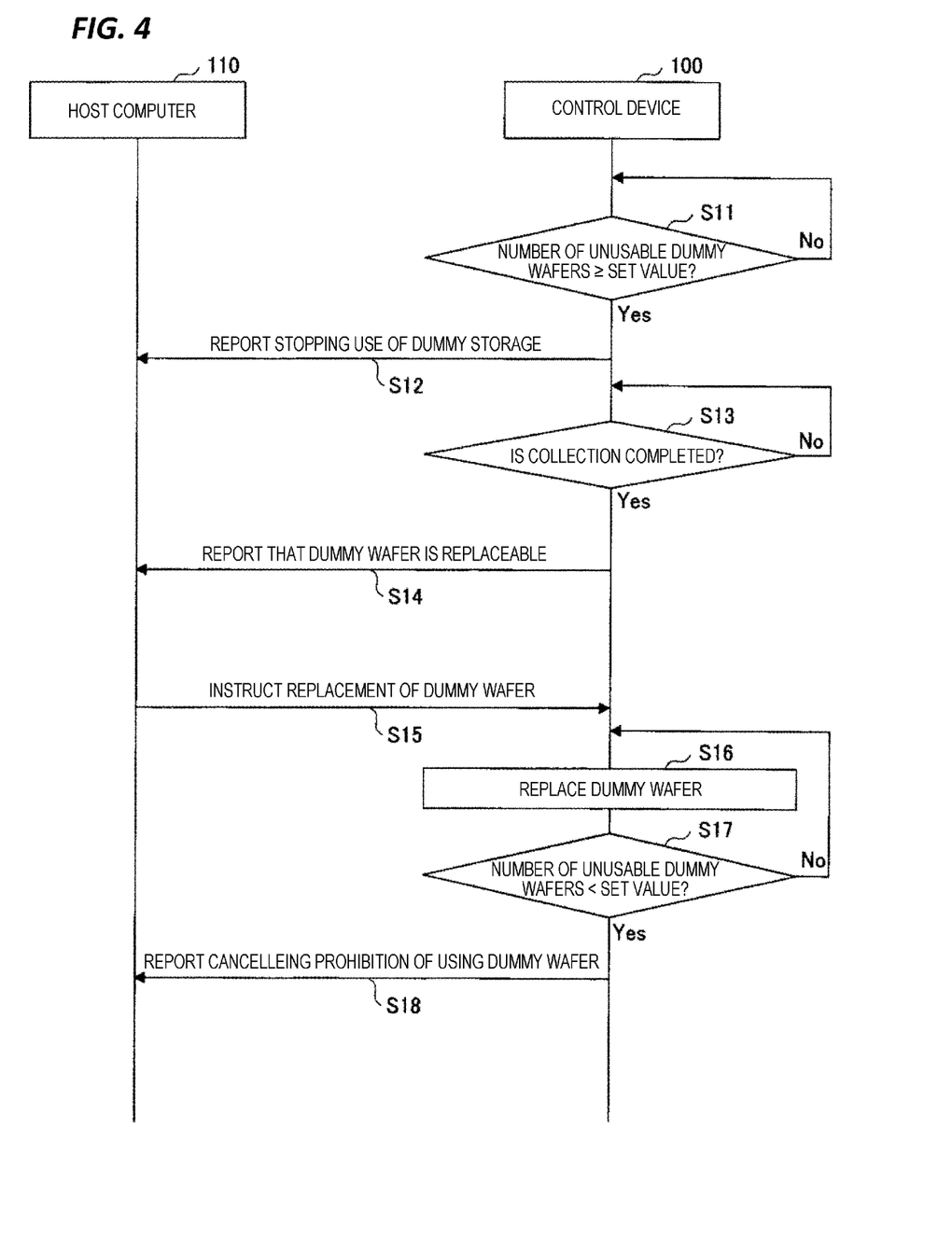
FIG. 4 is a sequence diagram illustrating a replacement timing notification process according to an embodiment of the present disclosure.

Next, a process of notifying the replacement timing of a dummy wafer (hereinafter referred to as a "replacement timing notification process") in the substrate processing apparatus 1 according to the embodiment of the present disclosure will be described. FIG. 4 is a sequence diagram illustrating a replacement timing notification process according to an embodiment of the present disclosure.

In step S11, the control device 100 determines whether or not the number of unusable dummy wafers among a plurality of dummy wafers accommodated in the dummy storage 20 is equal to or greater than a set value. The unusable dummy wafers may be, for example, dummy wafers having a cumulative film thickness thereon which is equal to or greater than a predetermined film thickness, or dummy wafers which have been subjected to a predetermined number of times of processing or more in the chamber 70. Set values are set by, for example, a user of the substrate processing apparatus 1 by inputting the set values via the control device 100 or the host computer 110. For example, when the number of dummy wafers that can be accommodated in the dummy storage 20 is 25, the set value may be set in the range of 1 to 25 dummy wafers. When the number of unusable dummy wafers is less than the set value (step S11: No), step S11 is repeated. When the number of unusable dummy wafers is equal to or greater than the set value (step S11: Yes), the process proceeds to step S12. When the number of dummy wafers accommodated in the dummy storage 20 is less than the set value, the control device 100 determines whether or not all the dummy wafers accommodated in the dummy storage 20 are unusable dummy wafers. When it is determined that all the dummy wafers are unusable, the process proceeds to step S12.

In step S12, the control device 100 prohibits unloading of the dummy wafers from the dummy storage 20 and transmits, to the host computer 110, a signal indicating that the dummy storage 20 is unusable. Further, the control device 100 may display a warning that the dummy wafers are unusable on the monitor of the substrate processing apparatus 1.

In step S13, the control device 100 determines whether or not all the dummy wafers unloaded from the dummy storage 20 are collected in the dummy storage 20. When some of the dummy wafers are not collected in the dummy storage 20 (step S13: No), step S13 is repeated until all the dummy wafers are collected in the dummy storage 20. When all the dummy wafers are collected in the dummy storage 20 (step S13: Yes), the process proceeds to step S14.

In step S14, the control device 100 transmits, to the host computer 110, a signal indicating that the dummy wafers in the dummy storage 20 are replaceable.

In step S15, the host computer 110 receives a signal from the control device 100 and transmits, to the control device 100, a signal instructing replacement of the dummy wafers.

In step S16, the control device 100 receives a signal instructing replacement of the dummy wafers from the host computer 110, and controls the operation of each constituent element of the substrate processing apparatus 1 so as to replace the unusable dummy wafers accommodated in the dummy storage 20.

In step S17, the control device 100 determines whether or not the number of dummy wafers that are unusable among the plurality of dummy wafers accommodated in the dummy storage 20 becomes less than the set value as a result of replacing the dummy wafers. When it is determined that the number of unusable dummy wafers is equal to or greater than the set value (step S17: No), the process returns to step S16 and replacement of dummy wafers is continued. When it is determined that the number of unusable dummy wafers is less than the set value in step S17 (step S17: Yes), the process proceeds to step S18.

In step S18, the control device 100 transmits, to the host computer 110, a signal for canceling prohibition of unloading of dummy wafers from the dummy storage 20.

As described above, in the substrate processing apparatus according to the embodiment of the present disclosure, the control device 100 determines whether or not the number of unusable dummy wafers is equal to or greater than the set value among the dummy wafers accommodated in the dummy storage 20. When the number of unusable dummy wafers is equal to or greater than the set value, the control device 100 notifies the host computer 110 of a warning. As a result, the host computer 110 is capable of determining the replacement timing of the dummy wafers in the dummy storage 20.

In the embodiment of the present disclosure, the load port 10 is an example of a container placing portion, the dummy storage 20 is an example of a dummy substrate accommodating unit, the first transport arm 41 is an example of a transport mechanism, the chamber 70 is an example of a processing chamber. In addition, the control device 100 is an example of a controller, and the host computer 110 is an example of an external control device. Further, the wafer is an example of a substrate, the product wafer is an example of a product substrate, and the dummy wafer is an example of a dummy substrate.

In the above-described embodiments, as the substrate processing apparatus, an apparatus for forming a film on a plurality of wafers by placing the wafers on the rotary table provided in the chamber 70 in the rotation direction of the rotary table, and supplying a gas from gas supply portions provided in the radial direction of the rotary table in a state where the rotary table is rotated has been described as an example, but the present disclosure is not limited thereto. The substrate processing apparatus may be any apparatus as long as it can perform a processing using a dummy wafer. For example, the substrate processing apparatus may be a single wafer type apparatus which processes wafers one by one, or a batch type apparatus which performs a processing collectively on a large number of wafers.

In the above-described embodiments, a case where the substrates are wafers has been described as an example, but the present disclosure is not limited thereto. The substrates may be, for example, a glass substrate or an LCD substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a container port configured to place thereon a transport container accommodating a product substrate therein;
    a dummy substrate storage provided separately from the container port and configured to accommodate dummy substrates therein;
    a transport chamber provided with a transport arm configured to transport the product substrate and the dummy substrates;
    a processing chamber configured to process the product substrate and the dummy substrates transported thereto by the transport arm in a state of accommodating the product substrate and the dummy substrates therein; and
    a controller configured to determine whether or not a number of unusable dummy substrates among the dummy substrates accommodated in the dummy substrate storage is equal to or greater than a set value, and notify an external controller of a warning when determined that the number of unusable dummy substrates is equal to or greater than the set value,
    wherein the controller is configured to prohibit unloading of the dummy substrates from the dummy substrate storage when determined that the number of unusable dummy substrates is equal to or greater than the set value.

2. The substrate processing apparatus of claim 1, wherein the controller is configured to notify the external controller that the dummy substrates are replaceable when all of the dummy substrates unloaded from the dummy substrate storage are collected in the dummy substrate storage.

3. The substrate processing apparatus of claim 2, wherein the controller is configured to replace the dummy substrates accommodated in the dummy substrate storage when a signal instructing replacement of the dummy substrates is received from the external controller.

4. The substrate processing apparatus of claim 3, wherein the controller is configured to cancel prohibition of unloading of the dummy substrates from the dummy substrate storage when replacement of the dummy substrates is completed and the number of unusable dummy substrates is less than the set value.

5. The substrate processing apparatus of claim 1, wherein the unusable dummy substrates are dummy substrates having a cumulative film thickness thereon which is equal to or greater than a predetermined film thickness, or dummy substrates subjected to a predetermined number of times of processing or more in the processing chamber.

6. The substrate processing apparatus of claim 1, wherein the controller is configured to determine whether all the dummy substrates are unusable dummy substrates when a number of the dummy substrates accommodated in the dummy substrate storage is less than the set value, and notify the external controller of a warning when determined that all the dummy substrates are unusable.

7. A method of notifying a replacement timing of a dummy substrate in a substrate processing apparatus, the method comprising:
    determining whether or not a number of unusable dummy substrates among dummy substrates accommodated in a dummy substrate storage provided separately from a container placing port configured to place thereon a transport container accommodating a product substrate therein is equal to or greater than a set value; and
    notifying an external controller of a warning when determined that the number of unusable dummy substrates is equal to or greater than the set value,
    prohibiting unloading of the dummy substrates from the dummy substrate storage when determined that the number of unusable dummy substrates is equal to or greater than the set value.

8. The substrate processing apparatus of claim 1, wherein the set value is set in a range of a number of dummy substrates that can be accommodated in the dummy substrate storage.

9. The method of claim 7, further comprising notifying the external controller that the dummy substrates are replaceable when all of the dummy substrates unloaded from the dummy substrate storage are collected in the dummy substrate storage.

10. The method of claim 9, further comprising replacing the dummy substrates accommodated in the dummy substrate storage when a signal instructing replacement of the dummy substrates is received from the external controller.

11. The method of claim 10, further comprising canceling prohibition of unloading of the dummy substrates from the dummy substrate storage when replacement of the dummy substrates is completed and the number of unusable dummy substrates is less than the set value.

12. The method of claim 7, wherein the unusable dummy substrates are dummy substrates having a cumulative film thickness thereon which is equal to or greater than a predetermined film thickness, or dummy substrates subjected to a predetermined number of times of processing or more in the processing chamber.

13. The method of claim 7, further comprising determining whether all the dummy substrates are unusable dummy substrates when a number of the dummy substrates accommodated in the dummy substrate storage is less than the set value, and notifying the external controller of a warning when determined that all the dummy substrates are unusable.

14. The method of claim 7, wherein the set value is set in a range of a number of dummy substrates that can be accommodated in the dummy substrate storage.

\* \* \* \* \*